United States Patent
Matsuo et al.

(10) Patent No.: US 8,099,621 B2
(45) Date of Patent: Jan. 17, 2012

(54) DATA RECEPTION APPARATUS AND MICROCOMPUTER HAVING THE SAME

(75) Inventors: Kazushi Matsuo, Nukata-gun (JP); Toshihiko Matsuoka, Nukata-gun (JP); Hideaki Ishihara, Okazaki (JP)

(73) Assignee: Denso Corporation, Kariya (JP)

( * ) Notice: Subject to any disclaimer, the term of this patent is extended or adjusted under 35 U.S.C. 154(b) by 766 days.

(21) Appl. No.: 12/285,581

(22) Filed: Oct. 9, 2008

(65) Prior Publication Data

US 2009/0096504 A1  Apr. 16, 2009

(30) Foreign Application Priority Data

Oct. 12, 2007  (JP) ................................. 2007-266843
Jun. 10, 2008  (JP) ................................. 2008-151618

(51) Int. Cl.
  *G06F 1/04* (2006.01)
(52) U.S. Cl. ......................................... 713/600; 331/16
(58) Field of Classification Search .................. 713/600; 331/16
  See application file for complete search history.

(56) References Cited

U.S. PATENT DOCUMENTS

| | | | |
|---|---|---|---|
| 4,489,289 A * | 12/1984 | Slobodnik et al. ........ | 331/107 A |
| 5,483,201 A | 1/1996 | Bortolini | |
| 7,148,763 B2 | 12/2006 | Sutardja | |
| 7,228,117 B2 | 6/2007 | Ichihara | |
| 7,356,719 B2 | 4/2008 | Matsuoka et al. | |
| 2003/0214432 A1 * | 11/2003 | Tawadrous et al. ........ | 342/357.1 |
| 2006/0245515 A1 | 11/2006 | Tachi | |
| 2007/0164832 A1 | 7/2007 | Matsuoka et al. | |

FOREIGN PATENT DOCUMENTS

| | | |
|---|---|---|
| JP | A-H5-75445 | 3/1993 |
| JP | A-5-191274 | 7/1993 |
| JP | A-H11-340820 | 12/1999 |
| JP | A-2002-305442 | 10/2002 |
| JP | A-2006-121171 | 5/2006 |

OTHER PUBLICATIONS

Office Action mailed Sep. 15, 2009 from the Japan Patent Office for corresponding patent application No. 2008-151618 (English translation enclosed).

LIN Consortium. "LIN Specification Package: Revision 2.0," Sep. 2003, pp. 1-16.

* cited by examiner

*Primary Examiner* — Clifford Knoll
(74) *Attorney, Agent, or Firm* — Posz Law Group, PLC

(57) ABSTRACT

A data reception apparatus includes: an oscillation circuit that multiplies or divides an oscillation signal from a CR oscillator based on a cycle setting value, and outputs a clock signal corresponding to the multiplied or divided oscillation signal; a temperature detector; a memory; a clock cycle setting element that reads the cycle setting value corresponding to the temperature from the memory, and inputs the cycle setting value into the oscillation circuit; a receiver that receives a data signal defined by the clock signal; a measurement element that measures a unit bit length of the data signal by counting the clock signal; and a correction element that corrects the cycle setting value based on a count value of the clock signal and a reference count value of a reference cycle corresponding to the unit bit length, and rewrites the cycle setting value with the corrected cycle setting value.

16 Claims, 11 Drawing Sheets

DATA RECEPTION APPARATUS AND MICROCOMPUTER HAVING THE SAME

CROSS REFERENCE TO RELATED APPLICATIONS

This application is based on Japanese Patent Application No. 2007-266843 filed on Oct. 12, 2007, and No. 2008-151618 filed on Jun. 10, 2008, the disclosures of which are incorporated herein by reference.

FIELD OF THE INVENTION

The present invention relates to a data reception apparatus having a CR oscillation circuit and a microcomputer having a data reception apparatus.

BACKGROUND OF THE INVENTION

A communication apparatus or a microcomputer uses an oscillator to generate an accurate and stable reference clock. Patent Documents 1 and 2 disclose technologies that correct temporal changes in a crystal oscillator. Because the oscillator is expensive, it is desirable to avoid using the oscillator. A CR oscillation circuit is an alternative to the oscillator. The CR oscillation circuit is easily subject to changes in oscillation cycles due to temperature changes and power supply voltage changes. In particular, the CR oscillation circuit cannot be used as a reference clock for onboard devices used under an environment subject to large temperature changes.

For example, the local interconnect network (LIN), one of communication protocols for onboard LAN, uses a synch byte field 0x55 added to the header of a frame transmitted from a master node. A slave node counts the synch byte field using the reference clock to calculate an accurate value for one bit time and settle a communication rate (for example, see Patent Document 3). During detection of the synchronization signal, however, the temperature may change to vary the reference clock, making it impossible to correctly transmit or receive data.

To solve this problem, Patent Document 4 discloses a microcomputer that is controlled to ensure the constant data transmission time for a communication circuit without varying a time constant for the CR oscillation circuit when an oscillation frequency varies with the temperature. The microcomputer uses memory to store data for determining a communication rate CMR that ensures a constant data transmission time per frame managed by the communication circuit. The microcomputer reads the data stored in the memory in accordance with a detected temperature and assigns the determined communication rate CMR to the communication circuit. When a temperature range has insufficient data, the microcomputer uses a linear function to interpolate between upper and lower limits and generate an approximate communication rate CMR.

Patent Document 1: JP-A-2004-282118 corresponding to U.S. Pat. No. 7,228,117
Patent Document 2: JP-A-2002-305442
Patent Document 3: JP-A-2006-311237 corresponding to U.S. Patent Application Publication No. 2006/0245515
Patent Document 4: JP-A-2006-270917 corresponding to U.S. Pat. No. 7,356,719

A correction means described in Patent Document 4 needs to previously measure initial characteristics of individual products and write data corresponding to the characteristics to the memory. It is preferable to prepare as many data as possible for reduce errors. Increasing the amount of data also increases the number of processes for measuring and writing the initial characteristics and accordingly increases costs. As mentioned above, only a limited number of data is used for linear interpolation between the data. An error may easily result from initial characteristics for the temperature range to be interpolated. An error in the initial characteristics cannot be corrected during actual operations after shipment from a manufacturer. In addition, the CR oscillation circuit is subject to a gradual change in oscillation frequencies with the lapse of time under the same temperature or voltage condition. The correction means described in Patent Document 4 needs to rewrite the data so as to be able to correct an error due to the temporal change.

Thus, it is desired to provide the data reception apparatus and the microcomputer capable of generating a clock signal with an accurate frequency even when a CR oscillation circuit is subject to a temperature, voltage, or temporal change.

SUMMARY OF THE INVENTION

In view of the above-described problem, it is an object of the present disclosure to provide a data reception apparatus having a CR oscillation circuit. It is another object of the present disclosure to provide a microcomputer having a data reception apparatus.

According to a first aspect of the present disclosure, a data reception apparatus includes: an oscillation circuit including a CR oscillator, wherein the CR oscillator outputs an oscillation signal, the oscillation circuit multiplies or divides the oscillation signal based on a cycle setting value, and the oscillation circuit outputs a clock signal corresponding to the multiplied or divided oscillation signal; a temperature detector that detects a temperature around the CR oscillator; a memory that stores the cycle setting value in association with the temperature; a clock cycle setting element that reads the cycle setting value corresponding to the temperature from the memory, and inputs the cycle setting value into the oscillation circuit; a receiver that receives a data signal defined by the clock signal; a measurement element that measures a unit bit length of the data signal by counting the clock signal; and a correction element that corrects the cycle setting value corresponding to the temperature based on a count value of the clock signal and a reference count value of a reference cycle corresponding to the unit bit length, and rewrites the cycle setting value with the corrected cycle setting value in association with the temperature in the memory.

The above data reception apparatus can generate the clock signal with an accurate cycle even when the temperature changes. Further, the data reception apparatus has a function of successively learning cycle setting values corresponding to temperatures based on the unit bit length for a synchronization signal in the received data signal. Accordingly, the data reception apparatus can improve the accuracy of the cycle setting value used for the temperature correction as the data reception apparatus receives synchronization signals at an accurate predetermined communication rate. Even when the CR oscillation cycle is subject to a temporal change, the above-mentioned update process can cancel the error.

According to a second aspect of the present disclosure, a data reception apparatus includes: an oscillation circuit including a CR oscillator, wherein the CR oscillator outputs an oscillation signal, the oscillation circuit multiplies or divides the oscillation signal based on a cycle setting value, and the oscillation circuit outputs a clock signal corresponding to the multiplied or divided oscillation signal; a temperature detector that detects a temperature around the CR oscillator; a voltage detector that detects a power supply voltage supplied to the CR oscillator; a memory that stores the cycle setting value in association with the temperature and the power supply voltage; a clock cycle setting element that reads the cycle setting value corresponding to the temperature and the power supply voltage from the memory, and inputs the cycle setting value into the oscillation circuit; a receiver that receives a data signal defined by the clock signal; a measurement element that measures a unit bit length of the data signal by counting the clock signal; and a correction element that corrects the cycle setting value corresponding to the temperature and the power supply voltage based on a count value of the clock signal and a reference count value of a reference cycle corresponding to the unit bit length, and rewrites the cycle setting value with the corrected cycle setting value in association with the temperature and the power supply voltage in the memory.

The above apparatus can successively learn cycle setting values at temperatures around the CR oscillator and power supply voltages supplied to the CR oscillator and generate the clock signal with an accurate cycle even though not only the temperature but also the power supply voltage changes.

According to a third aspect of the present disclosure, a microcomputer includes: a data reception apparatus of the first aspect. The clock signal provides a system clock signal.

The microcomputer includes the above-mentioned data reception apparatus and uses the data reception apparatus to receive the data signal. The CR oscillation circuit can generate the clock signal having an accurate frequency and use it as a system clock signal. The oscillator can be omitted to reduce costs. Each time a data signal is received, the data reception apparatus continues learning or correcting cycle setting values for determining clock signal frequencies. The data reception apparatus can generate the clock signal having an accurate frequency despite a temperature change, voltage change, or temporal change.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A first embodiment will be described in further detail with reference to FIGS. 1 through 4A and 4B.

Figure 1:
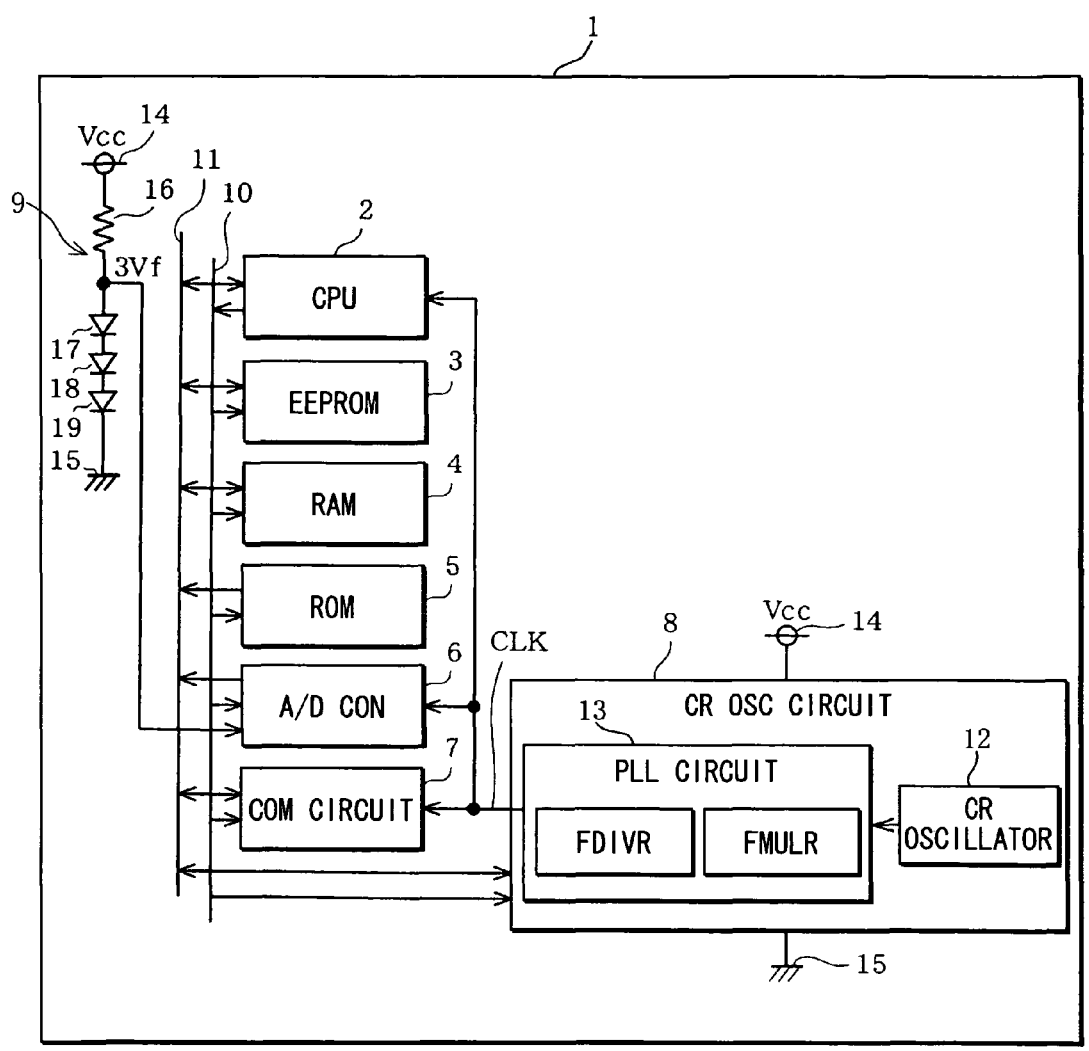
FIG. 1 is an electrical functional block diagram showing a microcomputer according to a first embodiment.

FIG. 1 is a functional block diagram showing an electrical configuration of a one-chip microcomputer 1 used for a vehicular electronic control unit (ECU). The microcomputer 1 includes a CPU 2, EEPROM 3 (equivalent to a storage means), RAM 4, ROM 5, an A/D converter 6, a communication circuit 7 (equivalent to a reception means) such as a universal asynchronous receiver/transmitter (UART), a CR oscillation circuit 8, and a temperature detection circuit (equivalent to a temperature detection means). The circuits except the temperature detection circuit 9 are connected to the CPU 2 via an address bus 10 and a data bus 11. The CPU 2 is equivalent to a clock cycle setting means, a measurement means, and a correction means. The circuits are supplied with power (voltage Vcc) via a power supply line 14 and a ground 15.

The CR oscillation circuit 8 includes a CR oscillator 12 and a phase locked loop (PLL) circuit 13. The PLL circuit 13 multiplies a signal oscillated from the CR oscillator 12 based on a frequency multiplier FMULR. The PLL circuit 13 divides the signal based on a frequency divisor FDIVR to generate and output a clock signal CLK. The frequency multiplier FMULR and the frequency divisor FDIVR are equivalent to cycle setting values. Registers in the CR oscillation circuit 8 store the frequency multiplier FMULR and the frequency divisor FDIVR.

The clock signal CLK is used as a system clock of the microcomputer 1 and is supplied to the CPU 2, the A/D converter 6, and the communication circuit 7. As the cycle setting values in the following description, the frequency divisor FDIVR is assumed to be constant and the frequency multiplier FMULR is assumed to be corrected. It may be preferable to assume the frequency multiplier FMULR to be constant and the frequency divisor FDIVR to be corrected or both the frequency multiplier FMULR and the frequency divisor FDIVR to be corrected.

The temperature detection circuit 9 is a series circuit including a resistor 16 and diodes 17 through 19 connected between the power supply line 14 and the ground 15. A connection node between the resistor 16 and the diode 17 is connected to an input terminal of the A/D converter 6. It is known that a forward voltage Vf of the diode has a temperature characteristic of −2.0 to −2.5 mV/° C. A forward voltage 3 Vf for the diodes 17 through 19 is supplied via the A/D converter 6. The temperature detection circuit 9 can detect the temperature corresponding to an A/D conversion value. The temperature detection circuit 9 is provided near the CR oscillator 12 on a semiconductor substrate so as to be able to detect the temperature of and near the CR oscillator 12.

The communication circuit 7 functions as a slave node for the LIN, one of serial communication protocols for onboard LAN. Frequencies of the clock signal CLK output from the CR oscillation circuit 8 are used to determine timing for the communication circuit 7 to receive each bit of a frame (equivalent to a data signal) and a communication rate (i.e., baud rate) for the communication circuit 7 to transmit the frame. A variation in the frequencies (i.e., cycles) of the clock signal CLK affects the transmission and reception.

According to the LIN specification 2.0, an oscillation tolerance of less than ±0.5% is allowed for master nodes and an oscillation tolerance of less than +1.5% is allowed for slave nodes. A slave node is allowed to be subject to a variation of less than ±14% from a predetermined frequency before synchronization. It is very difficult for a general CR oscillation circuit having no correction means to ensure an oscillation frequency variation of less than ±1.5% in a wide temperature range between −40° C. and +125° C., for example.

According to the embodiment, the CPU 2 uses the EEPROM 3 to store the frequency multiplier FMULR corresponding to a detected temperature T (actually an A/D conversion value). The CPU 2 reads the frequency multiplier FMULR corresponding to the detected temperature T (A/D conversion value) from the EEPROM 3 and supplies the frequency multiplier FMULR to the register in the CR oscillation circuit 8 to control the multiplier for the PLL circuit 13. As mentioned above, the embodiment assumes the frequency divisor FDIVR to be constant.

The CPU 2 measures the one-bit time (equivalent to a unit bit length) by counting the clock signal CLK each time the CPU 2 receives a synch byte field in the frame transmitted from the master node. The CPU 2 corrects the frequency multiplier FMULR corresponding to the detected temperature T based on a count value XA and a reference count value XB (one-bit time per reference cycle) based on the reference cycle for the one-bit time. The CPU 2 writes the corrected frequency multiplier FMULR to the EEPROM 3 correspondingly to the detected temperature T (A/D conversion value).

Operations of the embodiment will be described with reference to FIGS. 2 through 4A and 4B.

An inspection process is performed for the microcomputer 1 as a product before shipment. The process sets an initial value for the frequency multiplier FMULR and writes the value to the EEPROM 3. The frequency multiplier FMULR is determined so that the clock signal CLK matches a predetermined frequency such as 4 MHz when the microcomputer 1 is operated at the specified temperature T. The process writes, to the EEPROM 3, the A/D conversion value (equivalent to the detected temperature T) output from the A/D converter 6 and the determined frequency multiplier FMULR in association with each other. The process is performed at three temperatures such as −40° C., 25° C., and 125° C., for example.

There may be an alternative to the method of determining and writing the frequency multiplier FMULR on a product basis. It may be preferable to calculate the frequency multiplier FMULR based on a design value or a representative value for the corresponding product lot and write the frequency multiplier FMULR to the EEPROM 3 in association with the A/D conversion value (detected temperature T). Even when the frequency multiplier FMULR contains an error, the microcomputer 1 can cancel the error using a subsequent learning process to be described later.

Figure 2:
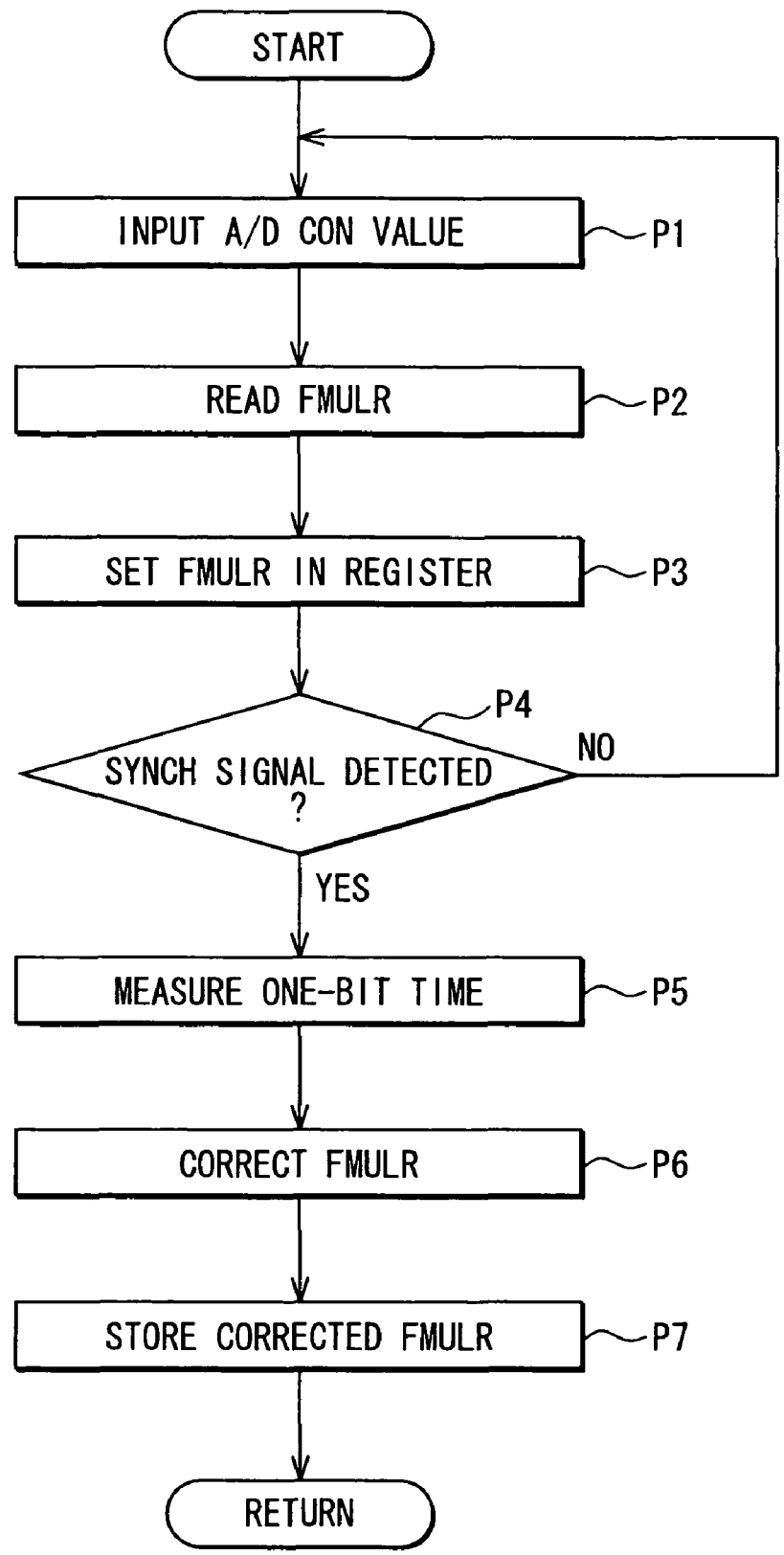
FIG. 2 is a flow chart showing a correction process for CR oscillation cycles.

FIG. 2 is a flow chart showing a CR oscillation cycle correction process the microcomputer 1 performs after shipment. At Step P1, the CPU 2 is supplied with an A/D conversion value from the A/D converter 6 to detect temperature T. The A/D conversion value corresponds to the temperature T of the CR oscillator 12. At Step P2, the CPU 2 reads the frequency multiplier FMULR corresponding to the A/D conversion value (i.e., detected temperature T) from the EEPROM 3. At Step P3, the CPU 2 allocates (i.e., sets) the frequency multiplier FMULR to a register in the CR oscillation circuit 8.

No frequency multiplier FMULR may correspond to the A/D conversion value. For example, there are frequency multipliers FMULR corresponding to two A/D conversion values next to and smaller and greater than the targeted A/D conversion value. A linear function may be used to interpolate the frequency multipliers FMULR and find an intended frequency multiplier FMULR. The PLL circuit 13 multiplies the original oscillation signal in accordance with the value of a register FMULR. The PLL circuit 13 then divides the oscillation signal in accordance with a specified frequency divisor FDIVR to output a clock signal CLK.

Figure 3:
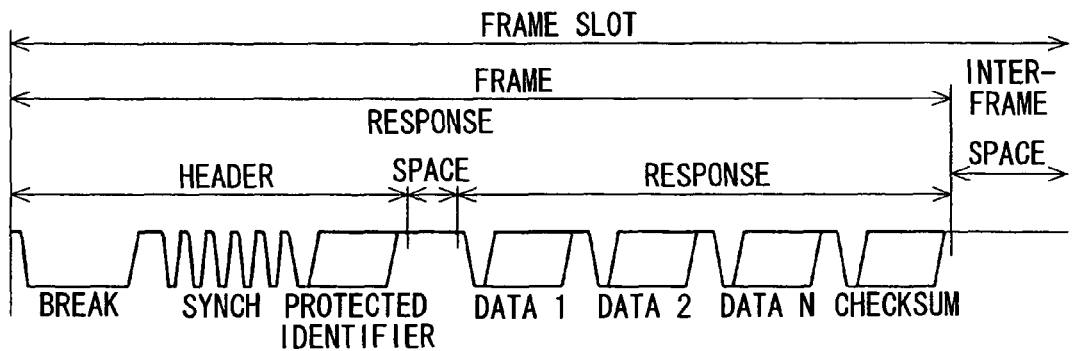
FIG. 3 shows an LIN frame configuration.

At Step P4, the CPU 2 determines whether or not to detect a synchronization signal transmitted from an LIN master node. FIG. 3 shows an LIN frame configuration. The frame transmitted from the master node includes a header. The header includes a break field, a synch byte field, and an identification field. The 13-bit break field indicates the beginning of a new frame. The synch byte field contains data value 0x55. The header can be identified when the communication circuit 7 receives the break field and the synch byte field.

The CPU 2 repeats the process from Steps P1 to P4 while the communication circuit 7 does not receive the header including the synch byte field as a synchronization signal. The CPU 2 does not correct the frequency multiplier FMULR during this period. The CPU 2 generates the clock signal CLK using a frequency multiplier FMULR already stored in the EEPROM 3.

The process proceeds to Step P5 when the communication circuit 7 receives the synch byte field. The CPU 2 measures a one-bit length. Specifically, the CPU 2 counts clock signals CLK to measure time 8 Tbit between both trailing edges of the first and seventh bits in the synch byte field. The CPU 2 divides the count value by 8 to find a count value XA for the one-bit time. When the master node transmits a frame at an accurate communication rate of 9600 bps, for example, the count value is 416 based on an accurate clock signal CLK of 4 MHz. A reference count value XB is calculated as a count value based on the reference cycle (¼ MHz=0.25 µs) for the one-bit time (1/9600=104.2 µs).

At Step P6, the CPU 2 calculates the frequency multiplier FMULR after the correction according to equation (1) below and allocates the frequency multiplier FMULR to the register of the PLL circuit 13. After the allocation, the PLL circuit 13 multiplies the original oscillation signal according to the new frequency multiplier FMULR after the correction.

$$(FMULR \text{ after correction}) = (\text{current } FMULR) \times XB/XA \quad (1)$$

At Step P7, the CPU 2 writes, to the EEPROM 3, the corrected frequency multiplier FMULR corresponding to the A/D conversion value (corresponding to detected temperature T). This process updates or overwrites the cycle setting value when the frequency multiplier FMULR corresponding to the detected temperature T is already written to the EEPROM 3. This process writes a new frequency multiplier FMULR to the EEPROM 3 when no frequency multiplier FMULR is written to the EEPROM 3 and the interpolation is used to find a frequency multiplier FMULR before correction. The process at Steps P1 through P7 is repeated.

Figure 4A:
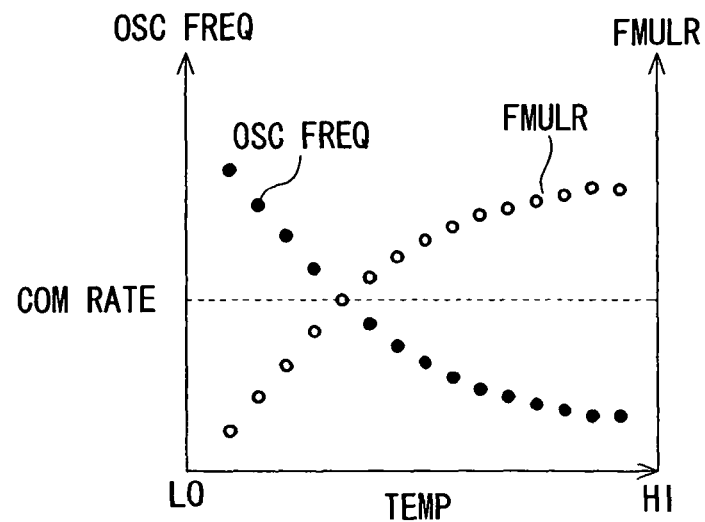
FIGS. 4A and 4B show temperature characteristics for oscillation frequencies of a CR oscillator and frequency multipliers FMULR.
Figure 4B:
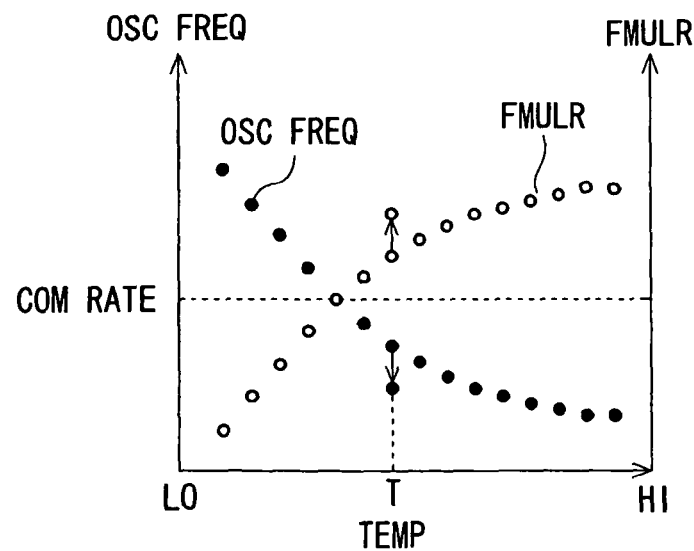

FIGS. 4A and 4B show characteristics of oscillation frequencies (black dots) and frequency multipliers FMULR (white dots) for the CR oscillator 12 in accordance with temperature changes. FIG. 4A shows characteristics before the correction. FIG. 4B shows a method of correcting the frequency multiplier FMULR when the oscillation frequency of the CR oscillator 12 is assumed to deviate at the detected temperature T. Actually, however, the oscillation frequency does not deviate only at the detected temperature T. In FIG. 4B, the oscillation frequency deviates at least in a temperature range around the detected temperature T.

As a characteristic, the CR oscillator 12 generally decreases an oscillation frequency as the temperature rises. The frequency multiplier FMULR tends to increase as the temperature rises. The CPU 2 corrects the frequency multiplier FMULR corresponding to the detected temperature T each time Steps P5 through P7 are performed on the condition of synchronization signal detection. In FIG. 4B, the oscillation frequency of the CR oscillator 12 and accordingly the frequency of the clock signal CLK decrease to decrease the count value XA. The correction is made to increase the frequency multiplier FMULR at the detected temperature T.

According to the embodiment, the EEPROM 3 stores the A/D conversion value indicating the temperature of the CR oscillator 12 and the frequency multiplier FMULR determining a multiplication for the CR oscillator 8 in association with each other. The microcomputer 1 in operation reads the frequency multiplier FMULR corresponding to the A/D conversion value (detected temperature T) and allocates the frequency multiplier FMULR to the register in the CR oscillation circuit 8. The frequency of the clock signal CLK can be constant even when the oscillation frequency of the CR oscillator 12 deviates due to a temperature change.

The CPU 2 counts the clock signal CLK to measure a one-bit length each time the CPU 2 receives the synchronization signal in the frame transmitted from the master node. The LIN ensures transmission of frames at a correct communication rate (COM RATE) from the master node. The CPU 2 corrects the frequency multiplier FMULR based on the count value XA and the reference count value XB. The count value XA corresponds to the one-bit clock signal CLK. The reference count value XB is found by dividing the original one-bit time by the reference cycle. The CPU 2 writes the corrected frequency multiplier FMULR corresponding to the detected temperature T onto the EEPROM 3.

The frequency multiplier FMULR can be updated to the most recent value corresponding to the temperature of the CR oscillator 12 each time a synchronization signal is received from the master node. When the EEPROM 3 does not store the frequency multiplier FMULR corresponding to the temperature, a new frequency multiplier FMULR can be generated and stored. The microcomputer 1 can successively learn frequency multipliers FMULR corresponding to temperatures of the CR oscillation circuit 8. The microcomputer 1 uses LIN communication waveforms for correction. There is no need for using a separate reference signal.

There may be a case where only a small number of initial values are available for the frequency multiplier FMULR or the initial value contains an error. The microcomputer can improve the accuracy of frequency multipliers FMULR used for the temperature correction as the microcomputer receives synchronization signals at an accurate predetermined communication rate. Even when the CR oscillator 12 is subject to a temporal change, the microcomputer can correct the frequency multiplier FMULR and maintain accurate frequencies for the clock signal CLK. Even when no synchronization signal is received from the master node for a long time, the microcomputer can correct the synchronization signal that may be received afterwards. The microcomputer can transmit and receive data without causing a communication error due to bit misalignment.

The clock signal CLK can be used as a system clock because the frequency of the clock signal CLK is constant independently of a temperature change or a temporal change (i.e., change with age). As a result, no oscillator is needed. The microcomputer according to the embodiment is available at a lower cost than a conventional microcomputer that uses an oscillator to generate the system clock.

Second Embodiment

Figure 5:
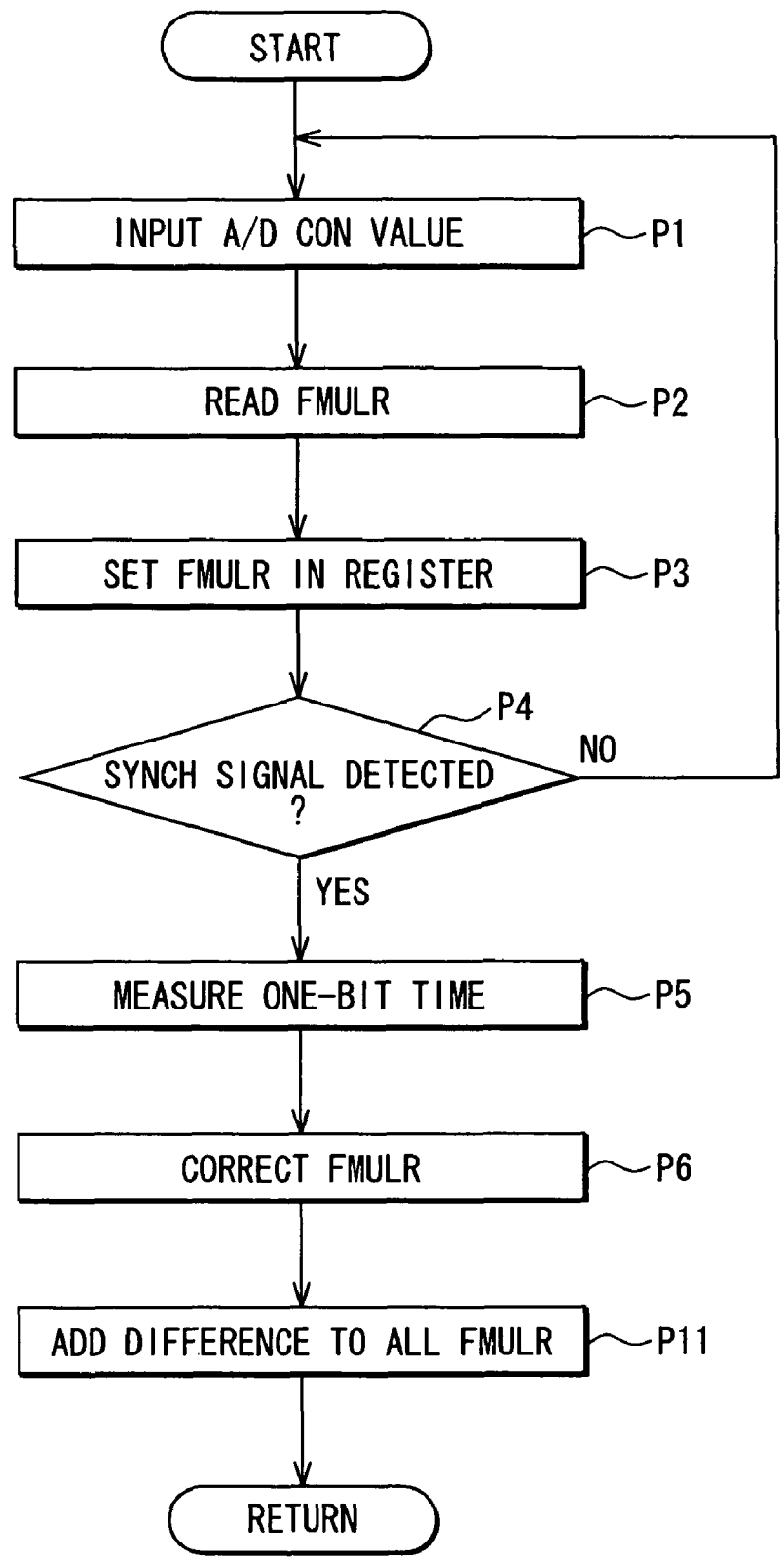
FIG. 5 is a flow chart showing a correction process for CR oscillation cycles according to a second embodiment.
Figure 6A:
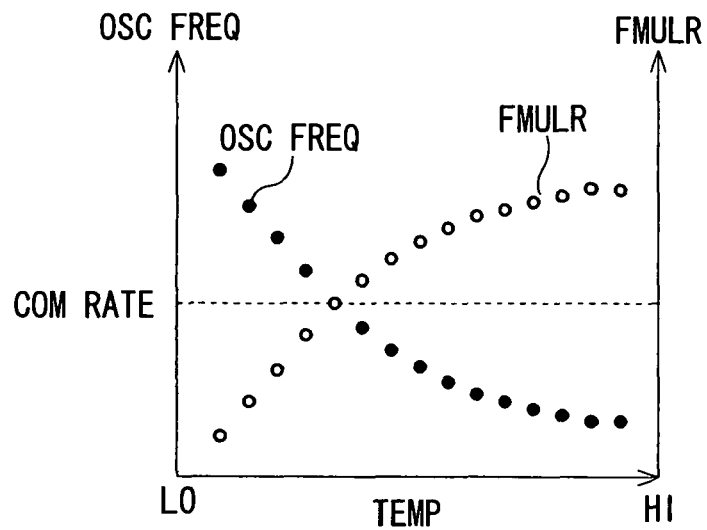
FIGS. 6A and 6B show temperature characteristics for oscillation frequencies of a CR oscillator and frequency multipliers FMULR according to the second embodiment.

A second embodiment will be described with reference to FIGS. 5, 6A and 6B.

The second embodiment differs from the first embodiment in the method of correcting the frequency multiplier FMULR stored in the EEPROM 3. FIG. 5 is a flow chart showing a CR oscillation cycle correction process. The same process step as in FIG. 2 is provided with the same step number. At Step P11, the CPU 2 uses equation (2) below to find a difference ΔFMULR between the corrected frequency multiplier FMULR and the current frequency multiplier FMULR before the correction. The CPU 2 adds the difference ΔFMULR to all frequency multipliers FMULR stored in the EEPROM 3.

$$\Delta FMULR = (FMULR \text{ after correction}) - (\text{current } FMULR) \quad (2)$$

Figure 6B:
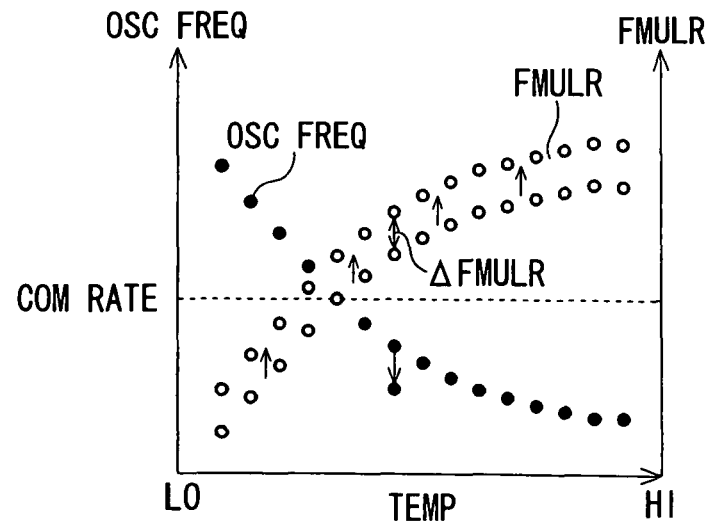

Similarly to FIGS. 4A and 4B, FIGS. 6A and 6B show characteristics of oscillation frequencies (black dots) and frequency multipliers FMULR (white dots) for the CR oscillator 12 in accordance with temperature changes. As shown in FIG. 6B, the correction quantity ΔFMULR for one detected temperature T is reflected on all frequency multipliers FMULR stored in the EEPROM 3 corresponding to temperatures. When a temporal change occurs in the CR oscillator 12, the method can correct all the frequency multipliers FMULR at a time. The method can correct even a frequency multiplier FMULR that corresponds to a rarely occurring temperature such as an extremely high or low temperature.

Instead of the above-mentioned method, all the frequency multipliers FMULR stored in the EEPROM 3 may be appended with a value resulting from weighting the difference ΔFMULR correspondingly to each temperature. When the oscillation frequency deviation due to a temporal change depends on temperatures, more accurate correction is available through the weighting in accordance with the deviation tendency.

Third Embodiment

Figure 7:
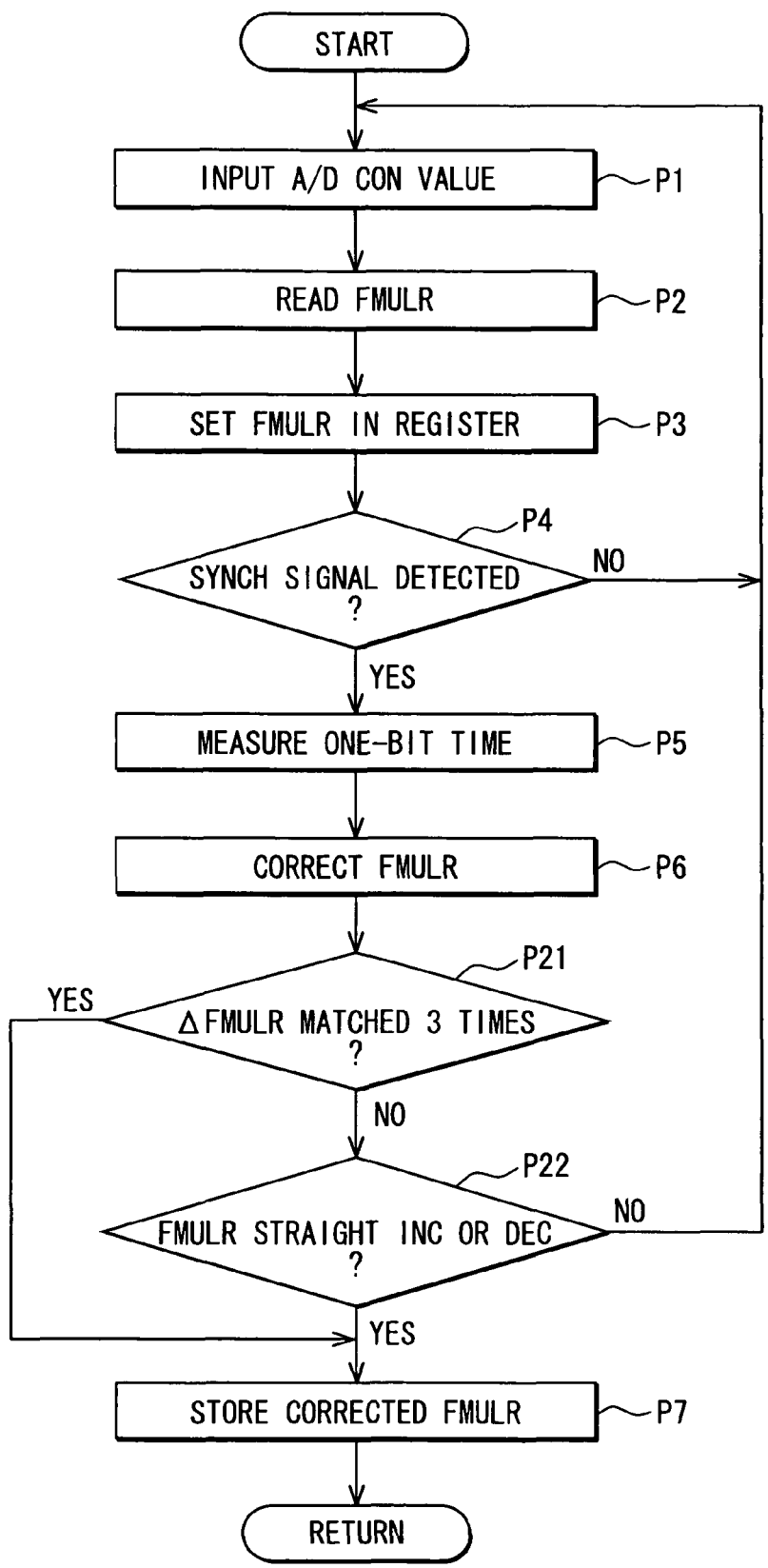
FIG. 7 is a flow chart showing a correction process for CR oscillation cycles according to a third embodiment.

A third embodiment will be described with reference to FIG. 7.

The third embodiment also differs from the first embodiment in the method of correcting the frequency multiplier FMULR stored in the EEPROM 3. FIG. 7 is a flow chart showing a CR oscillation cycle correction process. The same process step as in FIG. 2 is provided with the same step number.

At Step P21, the CPU 2 determines whether or not the difference ΔFMULR calculated from equation (2) is matched three times successively. When the match is successful (YES), control proceeds to Step P7. The CPU 2 writes, to the EEPROM 3, the corrected frequency multiplier FMULR corresponding to the A/D conversion value (detected temperature T). There may be a case where the difference ΔFMULR is 0 and the EEPROM 3 already stores the frequency multiplier FMULR corresponding to the detected temperature T. In such case, no write operation is needed.

When the match is unsuccessful (NO), control proceeds to Step P22. The CPU 2 determines whether or not the corrected frequency multiplier FMULR straight increases or decreases successively for the specified number of times (e.g., three times). Control proceeds to Step P7 when the corrected frequency multiplier FMULR straight increases or decreases (YES). Control returns to Step P1 otherwise (NO).

Step P21 functions as a filter to prevent the frequency multiplier FMULR from being incorrectly rewritten due to a measurement error. When the temperature changes drastically, Step P22 can disable the filter function that prevents or delays rewriting of the frequency multiplier FMULR.

Fourth Embodiment

A fourth embodiment will be described with reference to FIG. 8.

Figure 8:
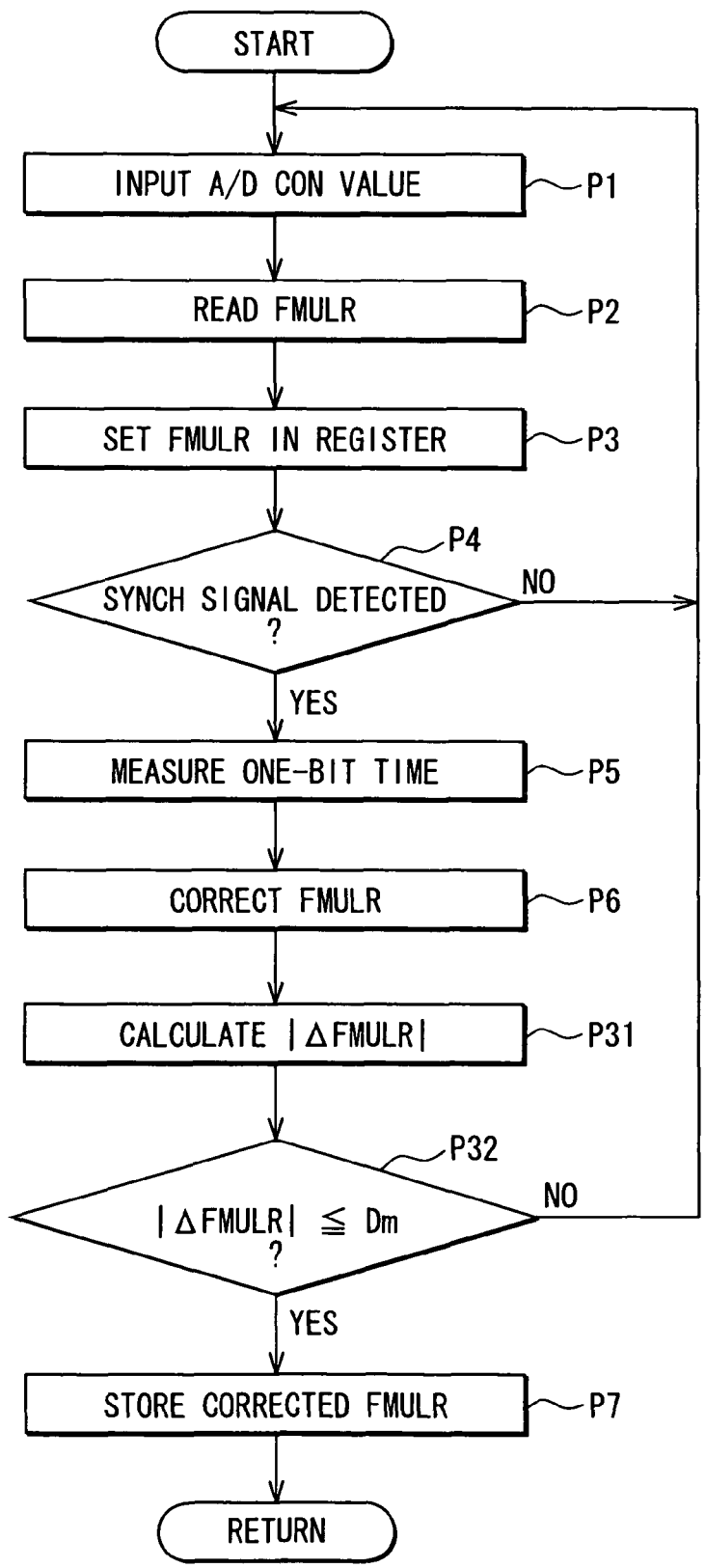
FIG. 8 is a flow chart showing a correction process for CR oscillation cycles according to a fourth embodiment.

FIG. 8 is a flow chart showing a CR oscillation cycle correction process. The same process step as in FIG. 2 is provided with the same step number and description is omitted for simplicity. The CPU 2 calculates the corrected frequency multiplier FMULR at Step P6 and then proceeds to Step P31. The CPU 2 uses equation (2) to find the difference ΔFMULR between the corrected frequency multiplier FMULR and the current frequency multiplier FMULR before the correction to acquire the absolute value |ΔFMULR|.

At Step P32, the CPU 2 compares the difference |ΔFMULR| with a limit value Dm. When the difference |ΔFMULR| is smaller than or equal to the limit value Dm, the CPU 2 proceeds to Step SP7 and writes the corrected frequency multiplier FMULR to the EEPROM 3. When the difference |ΔFMULR| is greater than the limit value Dm, the CPU 2 discards the corrected frequency multiplier FMULR (to return the register of the PLL circuit to the value before the correction), skips Step P7, and then returns to Step P1. The limit value Dm is defined as a variation width for the frequency multiplier FMULR corresponding to a maximum estimated temperature range. It is possible to avoid incorrect correction that exceeds the variation width.

Fifth Embodiment

A fifth embodiment will be described with reference to FIGS. 9 and 10.

The fifth embodiment is based on the configuration of the first embodiment and further ensures a constant frequency of the clock signal CLK even when the oscillation frequency of the CR oscillator 12 deviates due to a change in a power supply voltage Vcc applied to the CR oscillation circuit 8 (CR oscillator 12). Similarly to the first embodiment, the frequency divisor FDIVR is assumed to be constant and the frequency multiplier FMULR is assumed to be corrected in the following description.

Figure 9:
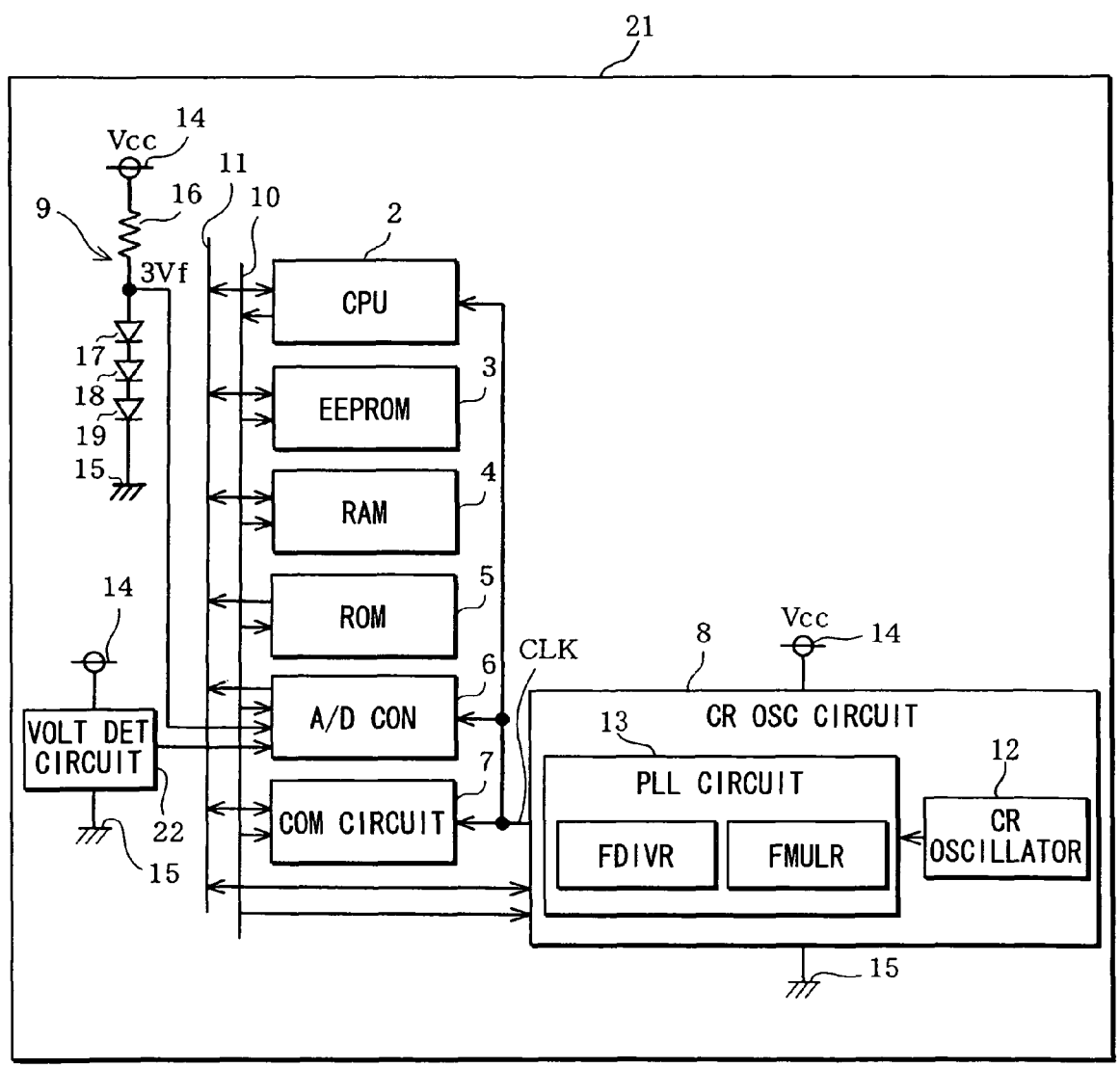
FIG. 9 is an electrical functional block diagram showing a microcomputer according to a fifth embodiment.

FIG. 9 is a functional block diagram showing an electrical configuration of the microcomputer. The mutually corresponding parts in FIGS. 9 and 1 are designated by the same reference numerals. A microcomputer 21 includes a voltage detection circuit 22 (equivalent to a voltage detection means) for detecting the power supply voltage Vcc by means of voltage dividing. The detected voltage is input to the A/D converter 6.

The CPU 2 uses the EEPROM 3 to store the frequency multiplier FMULR, the detected temperature T (actually an A/D conversion value), and the detected voltage Vcc (actually an A/D conversion value) in association with each other. From the EEPROM 3, the CPU 2 reads the frequency multiplier FMULR corresponding to the frequency multiplier FMULR (A/D conversion value) and the detected voltage Vcc (A/D conversion value) as appropriate. The CPU 2 supplies the read frequency multiplier FMULR to the register in the CR oscillation circuit to control the multiplier for the PLL circuit 13.

The CPU 2 corrects the frequency multiplier FMULR corresponding to the detected temperature T and the detected voltage Vcc each time the CPU 2 receives the synch byte field in the frame transmitted from the master node. The CPU 2 writes, to the EEPROM 3, the corrected frequency multiplier FMULR corresponding to the detected temperature T (A/D conversion value) and the detected voltage Vcc (A/D conversion value).

During an inspection process before shipment of the microcomputer 21, an initial value for the frequency multiplier FMULR is specified and is written to the EEPROM 3. The microcomputer 1 is operated under a specified temperature T and a specified power supply voltage Vcc. The frequency multiplier FMULR is determined so that the clock signal CLK matches a specified frequency (e.g., 4 MHz). The CPU 2 writes, to the EEPROM 3, the A/D conversion values (equivalent to the detected temperature T and the detected voltage Vcc) output from the A/D converter 6 and the determined frequency multiplier FMULR in association with each other. This operation is performed for multiple temperatures (e.g., −40° C., 25° C., and 125° C.) and multiple voltages (e.g., 4.95V, 5.00V, and 5.05V) to acquire nine frequency multipliers FMULR as a combination. Further, the frequency multiplier FMULR may be determined based on a design value or a representative value.

Figure 10:
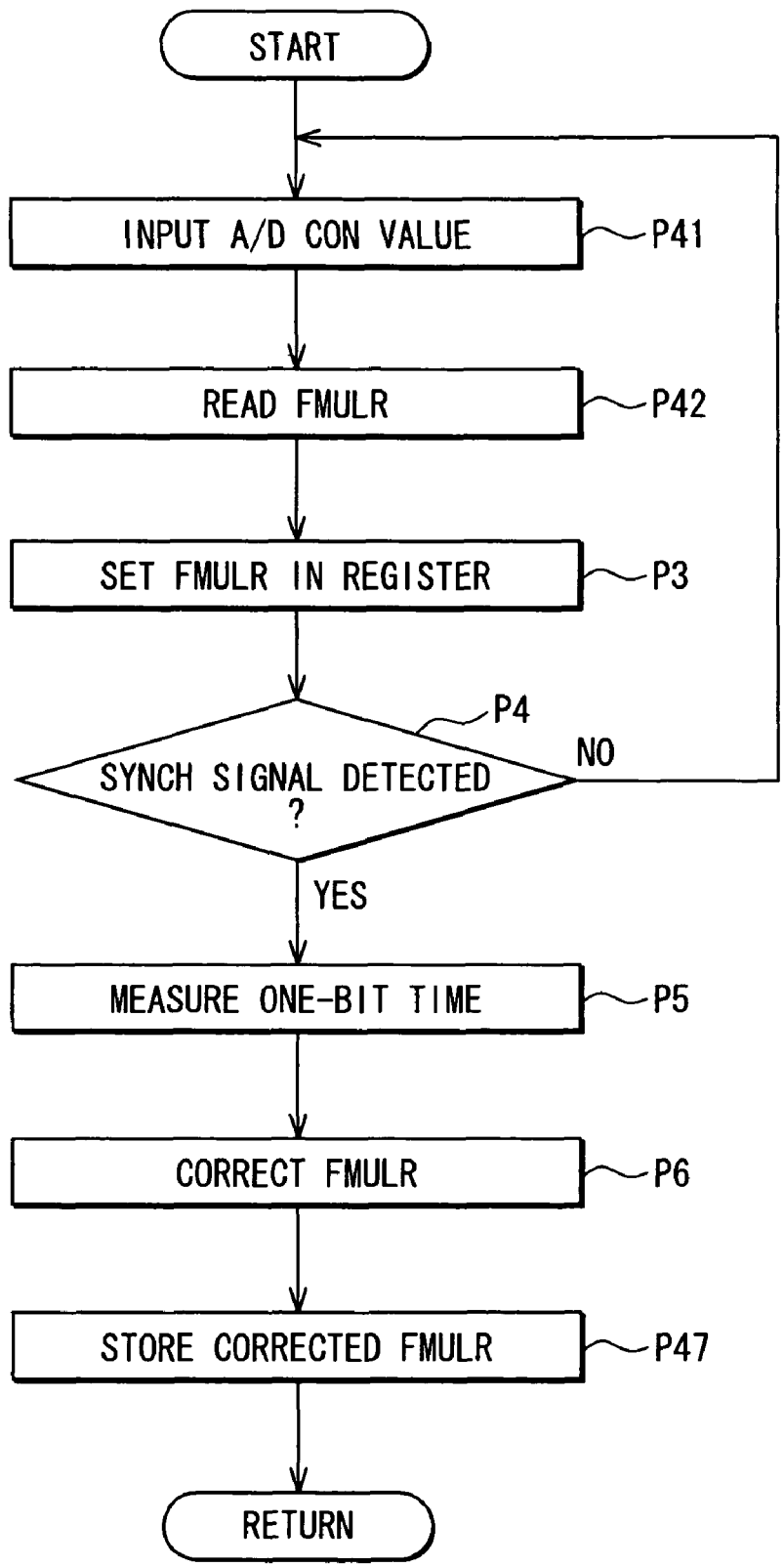
FIG. 10 is a flow chart showing a correction process for CR oscillation cycles according to the fifth embodiment.

FIG. 10 is a flow chart showing a CR oscillation cycle correction process the microcomputer 21 performs. The same process step as in FIG. 2 is provided with the same step number. At Step P41, the CPU 2 is supplied with an A/D conversion value corresponding to the temperature of the CR oscillator 12 and an A/D conversion value corresponding to the power supply voltage Vcc supplied to the CR oscillator 12. At Step P42, the CPU 2 reads the frequency multiplier FMULR corresponding to the A/D conversion values (detected temperature T and detected voltage Vcc) from the EEPROM 3. At Step P3, the CPU 2 allocates the frequency multiplier FMULR to the register in the CR oscillation circuit 8. The CPU 2 calculates the corrected frequency multiplier FMULR at Steps P3 through P6 as mentioned above. At Step P47, the CPU 2 writes the corrected frequency multiplier FMULR to the EEPROM 3 correspondingly to the A/D conversion values (detected temperature T and detected voltage Vcc).

The fifth embodiment can provide the same effect as the first embodiment. In addition, the fifth embodiment can ensure a constant frequency of the clock signal CLK even when the oscillation frequency of the CR oscillator 12 deviates due to not only a temperature change but also a power supply voltage change.

Sixth Embodiment

A sixth embodiment will be described with reference to FIGS. 11 and 12.

Figure 11:
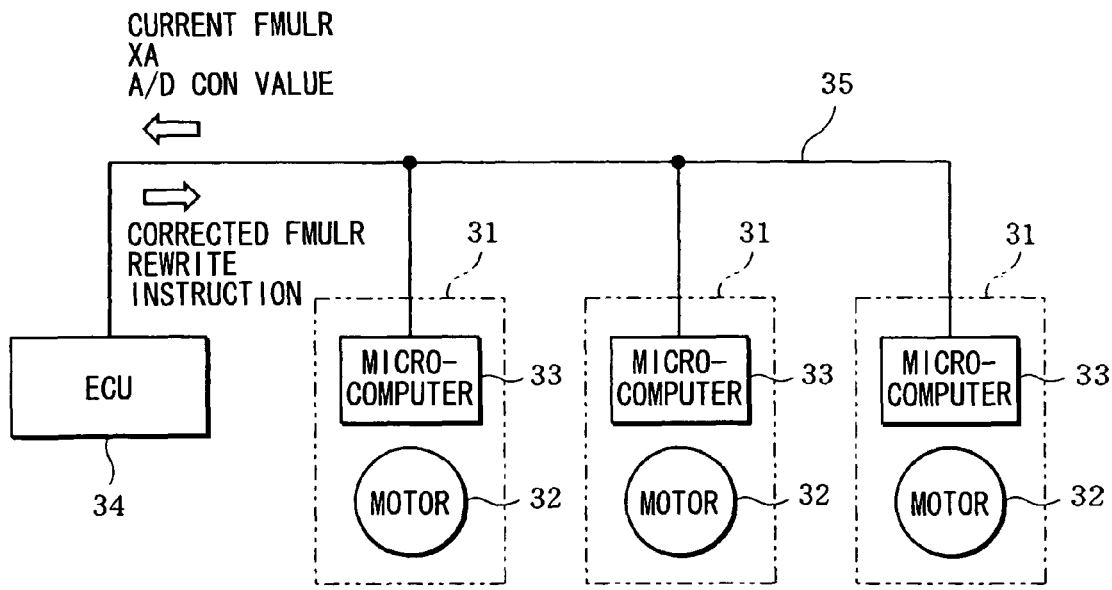
FIG. 11 shows a control system configuration of a vehicular actuator according to a sixth embodiment.

FIG. 11 shows a configuration of an onboard actuator control system. An actuator 31 includes a motor 32 and a microcomputer 33 for controlling the motor 32. A higher-order ECU 34 (equivalent to a higher-order computer) and multiple actuators 31 (three actuators in FIG. 11) are connected to each other through a bus 35 and are capable of LIN communication. The ECU 34 works as a master node. The actuator 31 works as a slave node.

The microcomputer 33 for the actuator 31 is electrically configured similarly to the above-mentioned microcomputer 1 or 21 but differs from the same in part of the process performed by the CPU 2. The following describes the electrical configuration similar to the microcomputer 1. The communication circuit 7 is also capable of data transmission and is equivalent to a reception means and a data transmission apparatus.

Figure 12:
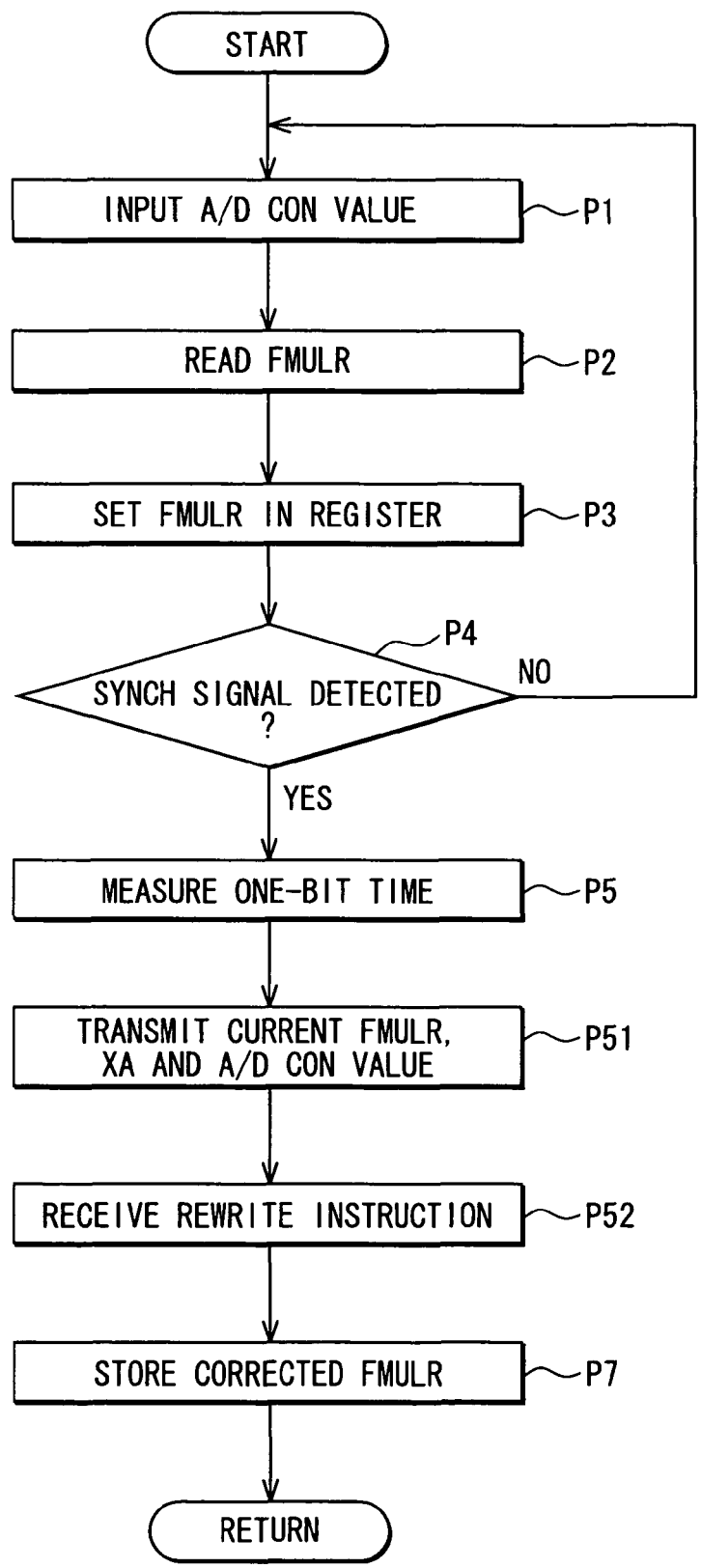
FIG. 12 is a flow chart showing a correction process for CR oscillation cycles according to the sixth embodiment.

FIG. 12 is a flow chart showing a CR oscillation cycle correction process. At Step P5, the CPU 2 acquires the count value XA for the one-bit time. At Step P51, the CPU 2 transmits the current (uncorrected) frequency multiplier FMULR, the count value XA, and the A/D conversion value (detected temperature T) to the ECU 34. The CPU 2 itself does not perform calculation for correcting the frequency multiplier FMULR.

When receiving the data from the actuator 31, the ECU 34 uses equation (1) to perform calculation for correcting the frequency multiplier FMULR in place of the microcomputer 33 for the actuator 31. The ECU 34 transmits a rewrite instruction to the actuator 31. The rewrite instruction contains the calculated value and data to be rewritten (an address to be stored in the EEPROM 3). The ECU 34 itself contains the count value XA for the one-bit time. At Step P52, the microcomputer 33 receives the rewrite instruction and allocates the received corrected frequency multiplier FMULR to the register in the PLL circuit 13. At Step P7, the microcomputer 33 writes the received corrected frequency multiplier FMULR to the EEPROM 3 correspondingly to the A/D conversion value (detected temperature T).

The microcomputer 33 for the actuator 31 eliminates an oscillator and features a small-scale, cost-effective configuration, but is designed to provide limited processing capabilities. The embodiment can reduce processing loads on the microcomputer 33 and supplement limited processing capabilities of the same.

Other Embodiments

The fifth embodiment may be modified similarly to the second embodiment. In this case, the CPU 2 uses equation (2) to find the difference ΔFMULR and adds the difference ΔFMULR to all the frequency multipliers FMULR that are stored in the EEPROM 3 and correspond to the temperatures and the power supply voltages. Further, the CPU 2 weights the difference ΔFMULR in accordance with each temperature and power supply voltage and adds the weighted difference ΔFMULR to all the frequency multipliers FMULR that are stored in the EEPROM 3 and correspond to the temperatures and the power supply voltages.

The fifth embodiment may be modified similarly to the third embodiment. In this case, the CPU 2 writes the corrected frequency multiplier FMULR to the EEPROM 3 correspondingly to the A/D conversion values (detected temperature T and detected voltage Vcc) when the difference ΔFMULR is matched for the specified number of times successively. Even though the difference ΔFMULR is not matched, the CPU 2 writes the corrected frequency multiplier FMULR to the EEPROM 3 correspondingly to the A/D conversion values (detected temperature T and detected voltage Vcc) when the corrected frequency multiplier FMULR straight increases or decreases successively for the specified number of times.

The fifth embodiment may be modified similarly to the second and third embodiments at the same time.

The fifth embodiment may include: an oscillation circuit; a voltage detection means for detecting a power supply voltage supplied to a CR oscillator; a storage means for storing a cycle setting value in association with a detected voltage; a clock cycle setting means for reading a cycle setting value corresponding to a detected voltage from the storage means and supplying the cycle setting value to the oscillation circuit; a reception means; a measurement means for counting a clock signal to measure a unit bit length of a data signal to be received; and a correction means that corrects a cycle setting value corresponding to the detected voltage based on a count value and a reference count value and writes the corrected cycle setting value to the storage means correspondingly to the detected voltage.

Writing an initial value to the EEPROM 3 may be unnecessary when the register in the PLL circuit 13 contains initial values for the frequency multiplier FMULR and the frequency divisor FDIVR. In this case also, the EEPROM 3 stores, as new data, the frequency multiplier FMULR corresponding to the temperature of the CR oscillator 12 each time the microcomputer 1 receives a synchronization signal from the master node.

When the frequency multiplier FMULR and the frequency divisor FDIVR are used to make the frequency of the clock signal CLK constant, the frequency divisor FDIVR may be also written to the EEPROM 3 correspondingly to the detected temperature or the detected temperature and the power supply voltage.

The reception means is not limited to the communication circuit 7 using the LIN for transmission and reception. The other communication networks or communication systems may be used to receive data signals.

The count value XA may be found by measuring time 8 Tbit between both trailing edges of the first and seventh bits in the synch byte field. The reference count value XB may be assumed to be a count value based on the reference cycle for this 8 Tbit. Measuring 8 Tbit is actually equivalent to measuring one-bit time Tbit. The unit bit length includes not only a one-bit length but also the other bit lengths corresponding to specified units such as a 2-bit length, an 8-bit length, and so on.

The second and third embodiments can be combined. When the difference ΔFMULR is matched three times successively, for example, the difference ΔFMULR is added to all the frequency multipliers FMULR stored in the EEPROM 3. The same applies when the corrected frequency multiplier FMULR straight increases or decreases successively for the specified number of times.

Instead of the resistor 16, a constant current circuit can be used to accurately detect a temperature even when the power supply voltage Vcc varies. The temperature detection means is not limited to the temperature detection circuit 9 and may use any circuit capable of detecting temperatures.

The above disclosure has the following aspects.

According to a first aspect of the present disclosure, a data reception apparatus includes: an oscillation circuit including a CR oscillator, wherein the CR oscillator outputs an oscillation signal, the oscillation circuit multiplies or divides the oscillation signal based on a cycle setting value, and the oscillation circuit outputs a clock signal corresponding to the multiplied or divided oscillation signal; a temperature detector that detects a temperature around the CR oscillator; a memory that stores the cycle setting value in association with the temperature; a clock cycle setting element that reads the cycle setting value corresponding to the temperature from the memory, and inputs the cycle setting value into the oscillation circuit; a receiver that receives a data signal defined by the clock signal; a measurement element that measures a unit bit length of the data signal by counting the clock signal; and a correction element that corrects the cycle setting value corresponding to the temperature based on a count value of the clock signal and a reference count value of a reference cycle corresponding to the unit bit length, and rewrites the cycle setting value with the corrected cycle setting value in association with the temperature in the memory.

In the above apparatus, the temperature detector detects the temperature around the CR oscillator. The data reception apparatus reads the cycle setting value (multiplier or division ratio, for example) corresponding to the detected temperature from the memory and supplies the cycle setting value to the oscillation circuit. The oscillation circuit multiplies or divides the oscillation signal from the CR oscillator based on the cycle setting value to output the clock signal. The cycle setting value is corrected with reference to the unit bit length of the data signal that is received by the receiver and has an accurate communication rate. The clock signal cycle is almost as accurate as the communication rate. Accordingly, the data reception apparatus can generate the clock signal with an accurate cycle even when the temperature changes.

When the receiver receives the data signal using the clock signal, the data reception apparatus measures the unit bit length of the data signal by counting the clock signal output from the oscillation circuit. The data reception apparatus corrects the cycle setting value corresponding to the detected temperature based on the count value (actual value) for the clock signal and the reference count value (reference value) based on the reference cycle for the unit bit length. The data reception apparatus writes the corrected cycle setting value to the memory correspondingly to the detected temperature.

The data reception apparatus can update the stored cycle setting value to a most recent value corresponding to the temperature detected during the measurement each time the data reception apparatus receives the data signal and measures the unit bit length of the same. Alternatively, the data reception apparatus can newly generate and store the cycle setting value when an interpolation is used to find a cycle setting value and no cycle setting value is stored correspondingly to the detected temperature. That is, the data reception apparatus has a function of successively learning cycle setting values corresponding to temperatures based on the unit bit length for a synchronization signal in the received data signal.

There may be a case where only a small number of initial values are available for the cycle setting value or the initial value contains an error. The data reception apparatus can improve the accuracy of the cycle setting value used for the temperature correction as the data reception apparatus receives synchronization signals at an accurate predetermined communication rate. Even when the CR oscillation cycle is subject to a temporal change, the above-mentioned update process can cancel the error.

Alternatively, the correction element may calculate a difference between the corrected cycle setting value and the cycle setting value in association with the temperature, and adds the difference to the cycle setting value corresponding to each temperature in the memory. When a temporal change causes frequency deviation, the data reception apparatus can correct the cycle setting values for the entire temperature range at a time. The data reception apparatus can correct even the cycle setting value that corresponds to a rarely occurring temperature such as an extremely high or low temperature, preventing an initial error or a temporal change from remaining.

Alternatively, the correction element may calculate a difference between the corrected cycle setting value and the cycle setting value in association with the temperature, and adds a value to the cycle setting value corresponding to each temperature in the memory. The value is obtained by weighting the difference with the temperature. This enables more appropriate correction in consideration for characteristics of an initial error and a temporal change different from temperature to temperature.

Alternatively, the correction element may rewrite the cycle setting value with the corrected cycle setting value only when the corrected cycle setting value is successively matched for a predetermined number of times. This can provide a filter function, eliminate an incorrect cycle setting value due to unsuccessful measurement, and stabilize the cycle setting value. Further, the correction element may rewrite the cycle setting value with the corrected cycle setting value when the corrected cycle setting value straight increases or decreases for the predetermined times and even when the corrected cycle setting value is not successively matched for the predetermined number of times. This makes it possible to reflect the correction of cycle setting value even when the cycle setting value is unstable and always changes straight due to a temperature change.

Alternatively, the measurement element may measure the unit bit length when the measurement element detects a predetermined synchronization signal contained in the data signal received by the receiver. The data reception apparatus can correct the cycle setting value each time the data reception apparatus receives the data signal having an accurate specified communication rate from a master node.

Alternatively, the correction element may calculate a difference between the corrected cycle setting value and the cycle setting value, and the correction element corrects and rewrites the cycle setting value when the difference is equal to or smaller than a predetermined threshold value. The threshold value is provided as a variation width for cycle setting values corresponding to a maximum range of estimated temperature and voltage changes. It is possible to avoid incorrect correction that exceeds the limit value.

According to a second aspect of the present disclosure, a data reception apparatus includes: an oscillation circuit including a CR oscillator, wherein the CR oscillator outputs an oscillation signal, the oscillation circuit multiplies or divides the oscillation signal based on a cycle setting value, and the oscillation circuit outputs a clock signal corresponding to the multiplied or divided oscillation signal; a temperature detector that detects a temperature around the CR oscillator; a voltage detector that detects a power supply voltage supplied to the CR oscillator; a memory that stores the cycle setting value in association with the temperature and the power supply voltage; a clock cycle setting element that reads the cycle setting value corresponding to the temperature and the power supply voltage from the memory, and inputs the cycle setting value into the oscillation circuit; a receiver that receives a data signal defined by the clock signal; a measurement element that measures a unit bit length of the data signal by counting the clock signal; and a correction element that corrects the cycle setting value corresponding to the temperature and the power supply voltage based on a count value of the clock signal and a reference count value of a reference cycle corresponding to the unit bit length, and rewrites the cycle setting value with the corrected cycle setting value in association with the temperature and the power supply voltage in the memory.

The above apparatus stores, reads, and corrects the cycle setting value, and settle the clock cycle correspondingly to not only the temperature detected around the CR oscillator but also the power supply voltage supplied to the CR oscillator. That is, there is provided the voltage detector for detecting the power supply voltage supplied to the CR oscillator. The clock cycle setting element reads, from the memory, the cycle setting value corresponding to the temperature detected by the temperature detector and the voltage detected by the voltage detector and supplies the cycle setting value to the oscillation circuit. The correction element corrects the cycle setting value based on the unit bit length of the data signal that is received by the receiver and ensures an accurate communication rate. The correction element writes the corrected cycle setting value to the memory correspondingly to the detected temperature and the detected voltage. These can successively learn cycle setting values at temperatures around the CR oscillator and power supply voltages supplied to the CR oscillator and generate the clock signal with an accurate cycle even though not only the temperature but also the power supply voltage changes.

According to a third aspect of the present disclosure, a microcomputer includes: a data reception apparatus of the first aspect. The clock signal provides a system clock signal.

The microcomputer includes the above-mentioned data reception apparatus and uses the data reception apparatus to receive the data signal. The CR oscillation circuit can generate the clock signal having an accurate frequency and use it as a system clock signal. The oscillator can be omitted to reduce costs. Each time a data signal is received, the data reception apparatus continues learning or correcting cycle setting values for determining clock signal frequencies. The data reception apparatus can generate the clock signal having an accurate frequency despite a temperature change, voltage change, or temporal change.

Alternatively, the microcomputer may further include: a data transmission apparatus for transmitting the data signal; and a higher order computer. The data transmission apparatus transmits the count value of the clock signal and the cycle setting value to the higher order computer instead of correcting the cycle setting value by the correction element. The higher-order computer corrects the cycle setting value based on the count value of the clock signal and the reference count value of the reference cycle corresponding to the unit bit length. The higher-order computer outputs the corrected cycle setting value to the oscillation circuit so that the corrected cycle setting value is set in the oscillation circuit. The higher-order computer rewrites the cycle setting value with the corrected cycle setting value in association with the temperature in the memory.

The higher-order computer performs correction instead of allowing the correction element of the data reception apparatus to correct the cycle setting value. For this purpose, the microcomputer includes the data transmission apparatus for transmitting the data signal. The data transmission apparatus transmits the following to the higher-order computer: the clock signal count value acquired by the measurement element of the data reception apparatus; and the cycle setting value read from the memory. The higher-order computer corrects the cycle setting value based on the clock signal count value and the reference count value based on the reference cycle for the unit bit length of the data signal and transmits the cycle setting value to the microcomputer. The data reception apparatus according to this aspect can reduce processing loads on the small-scale, low-cost microcomputer using no oscillator and supplement limited processing capabilities of the same.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A data reception apparatus comprising:
an oscillation circuit including a CR oscillator, wherein the CR oscillator outputs an oscillation signal, the oscillation circuit multiplies or divides the oscillation signal based on a cycle setting value, and the oscillation circuit outputs a clock signal corresponding to the multiplied or divided oscillation signal;
a temperature detector that detects a temperature around the CR oscillator;
a memory that stores the cycle setting value in association with the temperature;
a clock cycle setting element that reads the cycle setting value corresponding to the temperature from the memory, and inputs the cycle setting value into the oscillation circuit;
a receiver that receives a data signal defined by the clock signal;
a measurement element that measures a unit bit length of the data signal by counting the clock signal; and
a correction element that corrects the cycle setting value corresponding to the temperature based on a count value of the clock signal and a reference count value of a reference cycle corresponding to the unit bit length, and rewrites the cycle setting value with the corrected cycle setting value in association with the temperature in the memory.

2. The data reception apparatus of claim 1,
wherein the correction element calculates a difference between the corrected cycle setting value and the cycle setting value in association with the temperature, and adds the difference to the cycle setting value corresponding to each temperature in the memory.

3. The data reception apparatus of claim 1,
wherein the correction element calculates a difference between the corrected cycle setting value and the cycle setting value in association with the temperature, and adds a value to the cycle setting value corresponding to each temperature in the memory, and
wherein the value is obtained by weighting the difference with the temperature.

4. The data reception apparatus of claim 1,
wherein the correction element rewrites the cycle setting value with the corrected cycle setting value only when the corrected cycle setting value is successively matched for a predetermined number of times.

5. The data reception apparatus of claim 4,
wherein the correction element rewrites the cycle setting value with the corrected cycle setting value when the corrected cycle setting value straight increases or decreases for the predetermined times and even when the corrected cycle setting value is not successively matched for the predetermined number of times.

6. The data reception apparatus of claim 1,
wherein the measurement element measures the unit bit length when the measurement element detects a predetermined synchronization signal contained in the data signal received by the receiver.

7. The data reception apparatus of claim 1,
wherein the correction element calculates a difference between the corrected cycle setting value and the cycle setting value, and
wherein the correction element corrects and rewrites the cycle setting value when the difference is equal to or smaller than a predetermined threshold value.

8. A data reception apparatus comprising:
an oscillation circuit including a CR oscillator, wherein the CR oscillator outputs an oscillation signal, the oscillation circuit multiplies or divides the oscillation signal based on a cycle setting value, and the oscillation circuit outputs a clock signal corresponding to the multiplied or divided oscillation signal;

a temperature detector that detects a temperature around the CR oscillator;

a voltage detector that detects a power supply voltage supplied to the CR oscillator;

a memory that stores the cycle setting value in association with the temperature and the power supply voltage;

a clock cycle setting element that reads the cycle setting value corresponding to the temperature and the power supply voltage from the memory, and inputs the cycle setting value into the oscillation circuit;

a receiver that receives a data signal defined by the clock signal;

a measurement element that measures a unit bit length of the data signal by counting the clock signal; and a correction element that corrects the cycle setting value corresponding to the temperature and the power supply voltage based on a count value of the clock signal and a reference count value of a reference cycle corresponding to the unit bit length, and rewrites the cycle setting value with the corrected cycle setting value in association with the temperature and the power supply voltage in the memory.

9. The data reception apparatus of claim 8,
wherein the correction element calculates a difference between the corrected cycle setting value and the cycle setting value in association with the temperature and the power supply voltage, and adds the difference to the cycle setting value corresponding to each temperature and each power supply voltage in the memory.

10. The data reception apparatus of claim 8,
wherein the correction element calculates a difference between the corrected cycle setting value and the cycle setting value in association with the temperature and the power supply voltage, and adds a value to the cycle setting value corresponding to each temperature and each power supply voltage in the memory, and
wherein the value is obtained by weighting the difference with the temperature and the power supply voltage.

11. The data reception apparatus of claim 8,
wherein the correction element rewrites the cycle setting value with the corrected cycle setting value only when the corrected cycle setting value is successively matched for a predetermined number of times.

12. The data reception apparatus of claim 11,
wherein the correction element rewrites the cycle setting value with the corrected cycle setting value when the corrected cycle setting value straight increases or decreases for the predetermined times and even when the corrected cycle setting value is not successively matched for the predetermined number of times.

13. The data reception apparatus of claim 8,
wherein the measurement element measures the unit bit length when the measurement element detects a predetermined synchronization signal contained in the data signal received by the receiver.

14. The data reception apparatus of claim 8,
wherein the correction element calculates a difference between the corrected cycle setting value and the cycle setting value, and
wherein the correction element corrects and rewrites the cycle setting value when the difference is equal to or smaller than a predetermined threshold value.

15. A microcomputer comprising:
a data reception apparatus of claim 1,
wherein the clock signal provides a system clock signal.

16. The microcomputer of claim 15 further comprising:
a data transmission apparatus for transmitting the data signal; and
a higher order computer,
wherein the data transmission apparatus transmits the count value of the clock signal and the cycle setting value to the higher order computer instead of correcting the cycle setting value by the correction element,
wherein the higher-order computer corrects the cycle setting value based on the count value of the clock signal and the reference count value of the reference cycle corresponding to the unit bit length,
wherein the higher-order computer outputs the corrected cycle setting value to the oscillation circuit so that the corrected cycle setting value is set in the oscillation circuit, and
wherein the higher-order computer rewrites the cycle setting value with the corrected cycle setting value in association with the temperature in the memory.

* * * * *